United States Patent [19]

Yoshino et al.

[11] Patent Number: 4,582,721
[45] Date of Patent: Apr. 15, 1986

[54] PROCESS FOR PREPARING AMORPHOUS SILICON SEMICONDUCTOR

[75] Inventors: Masaaki Yoshino; Tsutomu Nanao, both of Kobe, Japan

[73] Assignee: Kanegafuchi Kagaku Kogyo Kabushiki Kaisha, Osaka, Japan

[21] Appl. No.: 701,645

[22] Filed: Feb. 14, 1985

Related U.S. Application Data

[63] Continuation of Ser. No. 623,545, Jun. 25, 1984, abandoned, which is a continuation of Ser. No. 382,639, May 27, 1982, abandoned.

[30] Foreign Application Priority Data

May 29, 1981 [JP]  Japan ................................ 56-83432
Feb. 1, 1982 [JP]  Japan ................................ 57-15061

[51] Int. Cl.⁴ ............................................. H01L 31/18
[52] U.S. Cl. ...................................... 427/39; 136/258; 357/2; 357/30; 427/74; 427/86
[58] Field of Search ........................... 427/39, 74, 86; 136/258 AM; 357/2, 30

[56]        References Cited
U.S. PATENT DOCUMENTS 4,239,554  12/1980  Yamazaki ........................... 136/255
4,365,107  12/1982  Yamauchi ........................... 136/258
4,369,205  1/1983   Winterling et al. .................. 427/39
4,388,482  6/1983   Hamakawa et al. ........... 136/258 AM

FOREIGN PATENT DOCUMENTS 56-45761  4/1981  Japan ................................. 136/258

Primary Examiner—Aaron Weisstuch
Attorney, Agent, or Firm—Armstrong, Nikaido, Marmelstein & Kubovcik

[57]           ABSTRACT

Preparation of an amorphous silicon semiconductor by glow discharge decomposition in an atmosphere containing a silicon compound in a glow discharge decomposition chamber which has a radio frequency electric field and a magnetic field crossing the electric field at right angles and in which the substrate is arranged substantially at right angles to the electric field. The amorphous silicon thin layer has excellent characteristics, particularly an excellent photoconductivity, can be prepared at a high rate of film formation, and also an amorphous semiconductor PIN homo- or hetero-junction photovoltaic device prepared according to the process of the invention has excellent characteristics.

16 Claims, 3 Drawing Figures

PROCESS FOR PREPARING AMORPHOUS SILICON SEMICONDUCTOR

This application is a continuation of application Ser. No. 623,545 filed June 25, 1984 now abandoned, which is a continuation of U.S. Ser. No. 382,639 filed May 27, 1982, now abandoned.

BACKGROUND OF THE INVENTION

The present invention relates to a process for preparing an amorphous silicon semiconductor.

Since it was found by W. E. Spear et al that the conductivity of the amorphous silicon obtained by a plasma decomposition method of silane ($SiH_4$) could be greatly altered by doping with phosphine ($PH_3$) and diborane ($B_2H_6$) and an amorphous silicon solar cell was fabricated on an experimental basis in 1976 by D. E. Carlson et al, the amorphous silicon solar cell has attracted much attention and studies with the aim of improving its efficiency have been numerous.

The Schottky barrier type, PIN type, MIS type and heterojunction type are known as structures of photovoltaic devices using an amorphous silicon thin film. It has been considered that the former three types have a bright future as high efficiency solar cells. For instance, D. E. Carlson et al obtained a conversion efficiency of 5.5% with a Schottky barrier solar cell in 1977. J. I. B. Willson et al obtained a conversion efficiency of 4.8% with an MIS type solar cell in 1978. Yoshihiro Hamakawa obtained a conversion efficiency of 4.5% with a PIN junction solar cell in 1978.

In the case of a PIN junction photovoltaic device, the characteristics thereof are greatly affected by the process for the preparation thereof. In many cases, the characteristics of amorphous silicon semiconductors are estimated by the photoconductivity, and the larger the photoconductivity of the thin film, the better. The photoconductivity of amorphous silicon semiconductors has a close relationship to hydrogen or fluorine included in amorphous silicon. A thin film of amorphous silicon containing hydrogen or fluorine shows a larger photoconductivity than amorphous silicon not containing them. The reason is considered to be that hydrogen or fluorine acts as a terminator for the dangling bonds. It is the present situation that the photovoltaic performance of a PIN junction photovoltaic device greatly varies depending on the preparation process, the preparation conditions, and so on, even if the content of hydrogen or fluorine in amorphous silicon to be formed into the respective thin film layers is the same and accordingly the photoconductivity of the undoped film is the same. Also, in any of the known processes, a desirable deposition rate of the film for providing a film having a good photoconductivity and a good photovoltaic performance is low, i.e. 1 to 2 angstroms/sec, and the known processes have the disadvantage that the productivity is low. The same obtains with the preparation of a photosensitive drum for use in plain paper copying, a charge coupled device or a thin film transistor. Accordingly, there is desired the development of a process for the preparation of an amorphous silicon thin film which can be practiced at a high film deposition rate and is excellent in junction characteristics.

It is an object of the present invention to provide a process for preparing an amorphous silicon semiconductor.

A further object of the invention is to provide a process for preparing an amorphous silicon semiconductor in which the deposition rate of a thin film is very high.

A still further object of the invention is to provide a process for preparing an amorphous silicon semiconductor which has an excellent junction characteristic.

Another object of the invention is to provide a process for preparing an amorphous silicon PIN junction solar cell having an excellent photovoltaic conversion efficiency.

It is a still further object to deposit an intrinsic amorphous silicon thin film on a P- or N-amorphous semiconductor to form a P-I or an N-I interface for a PIN homo- or heterojunction photovoltaic device in a magnetron type glow discharge decomposition chamber at a high film deposition rate with excellent junction characteristics and substantially without degrading the photoconductivity.

These and other objects of the present invention will become apparent from the description hereinafter.

SUMMARY OF THE INVENTION

In accordance with the present invention, there is provided a process for preparing an amorphous silicon semiconductor by glow discharge decomposition of a silicon compound, the process being improved in that the glow discharge decomposition is carried out in an atmosphere containing a silicon compound in a glow discharge decomposition chamber which has a radio frequency electric field and a magnetic field crossing the radio frequency electric field at about right angles and in which a substrate is arranged substantially at right angles to the radio frequency electric field.

In one embodiment, said process deposits an intrinsic amorphous silicon thin film on a P- or on an N-amorphous semiconductor to form a P-I or an N-I interface for a PIN homo- or heterojunction photovoltaic device in a magnetron type glow discharge decomposition chamber at a high film deposition rate, as shown in Table 3, with excellent junction characteristics, and substantially without lower conversion efficiency, as shown in Table 4.

With the proper selection of apparatus, steps and parameters, as described in more detail hereinafter, the desired deposition is achieved.

DETAILED DESCRIPTION

Figure 1:
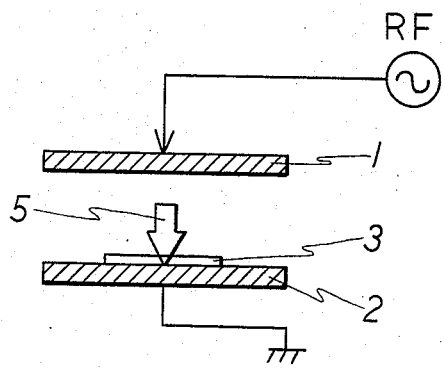
FIG. 1 is an illustrative view showing a diode coupled type plasma decomposition chamber employed in a conventional glow discharge decomposition method.

An amorphous silicon semiconductor has hitherto been prepared by a direct current glow discharge decomposition method, an inductive coupling type radio frequency glow discharge decomposition method, or a capacitive coupling type radio frequency glow discharge decomposition method. A diode coupled type radio frequency glow discharge decomposition method as shown in FIG. 1 is advantageous from the viewpoint of mass production. However, this method has the disadvantages that the film deposition rate is slow and the junction characteristics are poor. Further, there is a possibility that the substrate surface is bombarded by the plasma, and accordingly this method has also the disadvantage that the glow discharge power must be kept small.

According to the process of the present invention, an amorphous silicon semiconductor can be prepared at a high film deposition rate, and also, in the case of making a junction, an excellent junction characteristic can be obtained. The feature of the present invention resides in that a magnetic field is applied approximately at right angles to the radio frequency electric field and a substrate is placed substantially at right angles to the radio frequency field.

To this end, in one embodiment, this invention has the advantage that it provides a process for preparing an amorphous silicon semiconductor by glow discharge decomposition of a silicon compound, the improvement which comprises carrying out the glow discharge decomposition in an atmosphere containing a silicon compound in a glow discharge decomposition chamber which has spaced-apart electrodes, a radio frequency electric field, and a magnetic field crossing the radio frequency electric field at about right angles and in which a substrate is arranged substantially at right angles to the radio frequency field, said process including the step of depositing an intrinsic amorphous silicon thin film layer on a P- or on an N-amorphous semiconductor substrate to form a P-I or an N-I interface for a homo- or heterojunction photovoltaic device in a magnetron type glow discharge decomposition chamber at a high film deposition rate of above about 3 angstroms/second, with excellent junction characteristics, and substantially without increasing the non-radiative recombination centers in the P-I or the N-I interface, impairing the photoconductivity, or lowering the conversion efficiency of the device.

Figure 2:
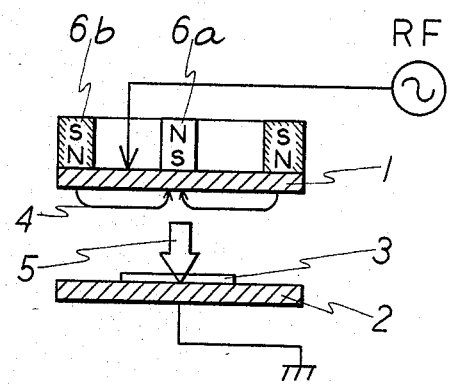
FIG. 2 is an illustrative view showing a planar magnetron type plasma decomposition chamber employed in the present invention.
Figure 3:
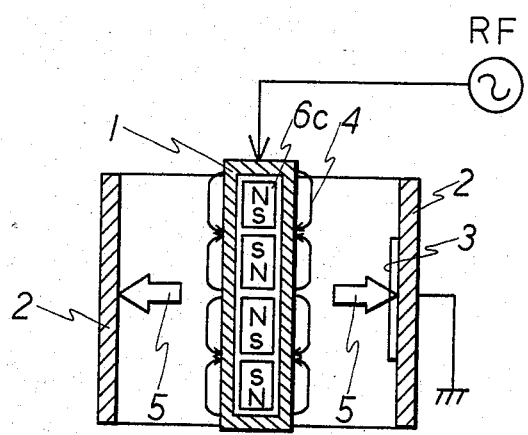
FIG. 3 is an illustrative view showing a coaxial magnetron type plasma decomposition chamber employed in the present invention.

Representative glow discharge decomposition apparatuses according to the present invention are a planar magnetron type apparatus as shown in FIG. 2 and an coaxial magnetron type apparatus as shown in FIG. 3. In the planar magnetron type apparatus shown in FIG. 2, a flat cathode 1 facing a grounded flat electrode 2 is provided on its reverse side with a central columnar magnet 6a and a circumferential annular magnet 6b such that the magnetic poles come into close contact with the surface of the cathode 1. In the coaxial magnetron type apparatus shown in FIG. 3, a cylindrical ground electrode 2 is arranged concentrically at the outside of a cylindrical cathode 1 with built-in NSSN recurring magnets 6c. It is also possible to wind beltlike magnets round the outer cylindrical electrode 2 with the recurring NSSN arrangement. In that case, the outer electrode is a cathode and the central electrode is grounded. In both the above-mentioned apparatuses, a magnetic field 4 is applied approximately at right angles to a radio frequency electric field 5. A substrate 3 is arranged on the ground electrode substantially at right angles to the RF electric field 5.

Preferably, the distance between the electrode provided with magnets and the substrate is from about 0.5 to about 5 cm.

The strength of the magnetic field is usually from 10 to 300 gauss, preferably from 15 to 250 gauss, at the surface of the substrate.

The glow discharge decomposition is carried out in a manner to be described hereinafter by employing a specific plasma decomposition chamber in which an RF electric field and a magnetic field are applied so that they cross approximately at right angles. The glow discharge is caused by application of the radio frequency electric field in an evacuated chamber to which a raw material gas containing a silicon compound, such as silane ($SiH_4$) or silicon tetrafluoride ($SiF_4$) and if necessary, further containing a carbon or nitrogen compound, is introduced with or without a compound of an element of Groups III or V of the Periodic Table such as phosphine ($PH_3$) or diborane ($B_2H_6$) for impurity doping. The gas components decomposed or excited by the plasma energy are deposited on the substrate to form amorphous silicon or other amorphous material thin films.

The silicon compound gas may be admixed with other compounds, e.g. a carbon compound such as hydrocarbons or carbon fluoride, nitrogen, or a nitrogen compound such as hydrides of nitrogen. In the case of conducting the glow discharge decomposition in an atmosphere containg a silicon compound, and a carbon compound and/or a nitrogen compound in a ratio of silicon compound:carbon compound:nitrogen compound=A:B:C by mole, it is desirable that the following equation is satisfied:

$$(B+C)/(A+B+C) > 0.001 \tag{1}$$

$$(B+C)/(A+B+C) > 0.001 \text{ and } C=0 \tag{2}$$

or $$(B+C)/(A+B+C) > 0.001 \text{ and } B=0 \tag{3}$$

In the above equations, the (B+C)/(A+B+C) ratio is preferably less than 0.5.

The present invention is effective for the preparation by glow discharge decomposition of amorphous semiconductors such as hydrogenated amorphous silicon (a-Si:H) of fluorinated amorphous silicon (a-Si:F:H) obtained by using a silane or silicon fluoride gas, a-SiC:H or a-SiC:F:H obtained by using a mixed gas of silane or silicon fluoride with a hydrocarbon, and a-SiN:H or a-SiN:F:H obtained by using a mixed gas of silane or silicon fluoride with a nitrogen compound, e.g. ammonia or hydrazine, and/or hydrogen. In particular, the present invention is effective for the preparation of amorphous semiconductors at a film deposition rate of not less than 3 angstroms/sec.

In the case of employing silane gas, amorphous semiconductors having excellent characteristics are obtained when a thin film is formed at a rate of 3 to 50 angstroms/sec. In case of employing disilane, it is possible to form a thin film at a higher rate, i.e. several hundred angstroms/sec. The same results are also obtained in the preparation of amorphous semiconductor by the glow discharge decomposition of a mixed gas containing a silicon compound and hydrocarbon and/or ammonia, e.g. amorphous silicon carbide of the general formula: a-$Si_{(1-x)}C_x$, amorphous silicon nitride of the general formula: a-$Si_{(1-y)}N_y$, amorphous silicon carbon nitride of the general formula: a-$Si_{(1-x-y)}C_xN_y$, and hydrides and fluorides thereof.

Further, the effects of the present invention are remarkable in the junction characteristics of the above-mentioned amorphous silicon semiconductors, e.g. PIN homo- or hetero-junction, heterojunction of undoped semiconductors, IN homo- or hetero-junction, and PI homo- or heterojunction. When fabricating amorphous silicon photovoltaic devices containing an intrinsic amorphous silicon thin film having a carrier life of not less than $10^{-7}$ second, a density of localized states of not more than $10^{17}/cm^2 \cdot eV$ and a carrier mobility of not less than $10^{-3}$ cm$^2$/V·sec., the film formation can be obtained at a high rate by employing the process of the present invention at least in the preparation of the intrinsic amorphous silicon layer. Further, since the optical energy gap Eg(opt) of the intrinsic amorphous silicon layer is reduced, i.e. to about 1.7 eV, the conversion efficiency is also remarkably improved. In particular, netic field on the surface of the substrate were 330, 250, 150, 110, 50, 30, 15, and 10 gauss at the electrode distances of 0.5, 1.0, 2.0, 3.0, 4.0, 5.0, 6.0 and 7.0 cm., respectively.

The dark conductivity $\sigma d$ and activation energy $\Delta E$ of the thin films were measured. Also, the photoconductivity $\sigma ph$ was measured under a solar illumination of 100 mW/cm$^2$. (AM-1 solar simulator made by Ushio Electric Industry Co., Ltd.). The results are shown in Table 1.

TABLE 1

| | | | | | | | |
|---|---|---|---|---|---|---|---|
| Electrode distance (cm) | 0.5 | 1.0 | 2.0 | 3.0 | 4.0 | 5.0 | 6.0 |
| RF power (W) | 10 | 10 | 10 | 10 | 10 | 10 | 10 |
| Example 1 | | | | | | | |
| Film deposition rate (Å/sec) | 18 | 14 | 10 | 6.5 | 4.0 | 1.1 | 0.8 |
| Photoconductivity $(\Omega \cdot cm)^{-1}$ | $1 \times 10^{-4}$ | $2 \times 10^{-4}$ | $5 \times 10^{-4}$ | $3 \times 10^{-4}$ | $1.5 \times 10^{-4}$ | $0.8 \times 10^{-4}$ | $0.5 \times 10^{-4}$ |
| Dark conductivity $(\Omega \cdot cm)^{-1}$ | $5 \times 10^{-8}$ | $1 \times 10^{-8}$ | $7 \times 10^{-9}$ | $2 \times 10^{-10}$ | $4 \times 10^{-10}$ | $5 \times 10^{-10}$ | $3 \times 10^{-10}$ |
| Activation energy (eV) | 0.65 | 0.74 | 0.76 | 0.83 | 0.87 | 0.87 | 0.88 |
| Comparative Example 1 | | | | | | | |
| Film deposition rate (Å/sec) | 12 | 10 | 7 | 4 | 2.5 | 0.8 | 0.5 |
| Photoconductivity $(\Omega \cdot cm)^{-1}$ | $8 \times 10^{-5}$ | $5 \times 10^{-5}$ | $6 \times 10^{-5}$ | $7 \times 10^{-5}$ | $9 \times 10^{-5}$ | $1 \times 10^{-4}$ | $1 \times 10^{-4}$ |
| Dark conductivity $(\Omega \cdot cm)^{-1}$ | $7 \times 10^{-7}$ | $4 \times 10^{-7}$ | $1 \times 10^{-7}$ | $8 \times 10^{-8}$ | $5 \times 10^{-8}$ | $1 \times 10^{-8}$ | $5 \times 10^{-9}$ |
| Activation energy (eV) | 0.55 | 0.61 | 0.65 | 0.68 | 0.71 | 0.76 | 0.75 |
| Electrode distance (cm) | | 2.0 | 2.0 | 2.0 | 2.0 | 2.0 | 2.0 |
| RF power (W) | | 5 | 7 | 10 | 13 | 16 | 20 |
| Example 1 | | | | | | | |
| Film deposition rate (Å/sec) | | 3.5 | 6 | 10 | 14.5 | 18 | 27 |
| Photoconductivity $(\Omega \cdot cm)^{-1}$ | | $2 \times 10^{-4}$ | $3 \times 10^{-4}$ | $5 \times 10^{-4}$ | $8 \times 10^{-4}$ | $6 \times 10^{-4}$ | $7 \times 10^{-4}$ |
| Dark conductivity $(\Omega \cdot cm)^{-1}$ | | $2 \times 10^{-10}$ | $4 \times 10^{-10}$ | $7 \times 10^{-9}$ | $4 \times 10^{-9}$ | $8 \times 10^{-9}$ | $1 \times 10^{-8}$ |
| Activation energy (eV) | | 0.83 | 0.8 | 0.76 | 0.76 | 0.74 | 0.73 |
| Comparative Example 1 | | | | | | | |
| Film deposition rate (Å/sec) | | 2.0 | 4.5 | 7 | 12 | 14 | 19 |
| Photoconductivity $(\Omega \cdot cm)^{-1}$ | | $2 \times 10^{-4}$ | $9 \times 10^{-5}$ | $6 \times 10^{-5}$ | $6 \times 10^{-5}$ | $3 \times 10^{-5}$ | $2 \times 10^{-5}$ |
| Dark conductivity $(\Omega \cdot cm)^{-1}$ | | $2 \times 10^{-8}$ | $8 \times 10^{-8}$ | $1 \times 10^{-7}$ | $8 \times 10^{-7}$ | $9 \times 10^{-7}$ | $1 \times 10^{-6}$ |
| Activation energy (eV) | | 0.72 | 0.61 | 0.65 | 0.54 | 0.52 | 0.45 | the improvement of the efficiency is marked when the amorphous silicon photovoltaic device is fabricated into a PIN heterojunction photovoltaic device in which at least the P or N type amorphous semiconductor located at the incident light side has an optical energy gap Eg-(opt) of not ess than about 1.85 eV and a dark conductivity of not less than about $10^{-8}$ $(\Omega \cdot cm.)^{-1}$ at 20° C. and the diffusion potential is not less than about 1.1 V. In general, an amorphous silicon semiconductor obtained by glow discharge decomposition of silane has a slightly N-type conductivity. In addition to such a semiconductor, an amorphous silicon semiconductor which is made neutral or slightly P-type by employing P-type dopants during glow discharge decomposition of silane can also be effectively employed as an I-type layer.

The present invention is more specifically described and explained by means of the following Examples.

It is to be understood that the present invention is not limited to the Examples and various changes and modifications may be made in the invention without departing from the spirit and scope thereof.

EXAMPLE 1 AND COMPARATIVE EXAMPLE 1

A planar magnetron type plasma decomposition apparatus as shown in FIG. 2 was employed as the apparatus for practicing the present invention. Also, a diode coupled type plasma decomposition apparatus as shown in FIG. 1 was employed for comparison. The distance between the electrodes was variable within the range of 0.5 to 6 cm., and the area of the electrode was 314 cm$^2$.

Amorphous silicon thin films having a thickness of about 5,000 angstroms were formed on glass substrates (commercial name "Corning #7059" made by Corning Glass Works) at a substrate temperature of 250° C. by employing 100% SiH$_4$ gas. The strengths of the mag- As understood from Table 1, according to the present invention, the deposition rate is increased with decreasing distance between the electrodes, and moreover a thin film having a relatively large photoconductivity is obtained. The deposition rate is increased with decreasing distance between the electrodes in Comparative Example 1, too, but the photoconductivity and the activation energy become small, thus providing a semiconductor of strong N-type. It would also be understood from the results for the thin films prepared under the varied RF power condition that whereas the thin films prepared by the process of the present invention show good characteristics within a wide range of film deposition rate, the thin films prepared at a film deposition rate of more than 2 angstroms/sec. by the conventional process have low photoconductivity, low activation energy and increased dark conductivity, thus providing an N-type semiconductor.

EXAMPLE 2 AND COMPARATIVE EXAMPLE 2

PIN junction devices were fabricated according to the process of the present invention using the planar magnetron type plasma decomposition apparatus as shown in FIG. 2 and according to a conventional process using the diode coupled type plasma decomposition apparatus as shown in FIG. 1, and the junction characteristics thereof were estimated on the basis of the characteristics for a solar cell.

A P-type a-SiC:H layer having a thickness of 100 angstroms, an I-type a-Si:H layer having a thickness of 5,000 angstroms, and an N-type a-Si:H layer having a thickness of 500 angstroms were successively formed in that order on a glass/ITO substrate. The P-type a-

SiC:H layer was prepared under the conditions of $B_2H_6/(0.5SiH_4+0.5CH_4)=0.1\%$, electrode distance 2.0 cm. and RF power of 5 W. The I-type a-Si:H layer was prepared under the conditions of electrode distance 2 cm. and RF power of 10 W. The N-type a-Si:H layer was prepared under the conditions of $PH_3/SiH_4+1\%$, electrode distance 2 cm. and RF power of 10 W. An aluminum electrode of 1 cm. square was attached to the obtained device, and the J-V characteristic was measured using AM-1 solar illumination of 100 mW/cm$^2$.

The results are shown in Table 2.

TABLE 2

|  | Jsc (mA/cm$^2$) | Voc (volt) | FF (%) | η (%) |
|---|---|---|---|---|
| Ex. 2 | 17.1 | 0.900 | 61 | 9.4 |
| Comp. Ex. 2 | 12.5 | 0.86 | 56 | 6.0 |

(Note)
Jsc: Short-circuit current density
Voc: Open circuit voltage
FF: Curve fill factor
η: Conversion efficiency There is a large difference in short-circuit current density between Example 2 and Comparative Example 2. The reason is that the optical energy gap of the I-layer of the device obtained in Comparative Example 2 is high, i.e. 1.8 eV, whereas the optical energy gap of the I-layer in Example 2 is 1.7 eV, and that in Comparative Example 2, the junction interfaces, particularly the P-I interface, are damaged by plasma bombardment.

Also, the same results were obtained in the case where the I-layer was deposited by the process of the present invention but the P- and N-layers were deposited without a magnetic field and these P-, I- and N-layers were successively deposited in that order.

EXAMPLE 3 AND COMPARATIVE EXAMPLE 3

The apparatus as shown in FIG. 2 was employed for the Example and the apparatus as shown in FIG. 1 was employed for the Comparative Example. The distance between the electrodes was 6 cm., and the area of the electrode was 314 cm$^2$.

Intrinsic amorphous silicon thin film layers having a thickness of about 5,000 angstroms were formed on glass substrates (commercial name "Corning #7059", made by Corning Glass Works) by employing 20% SiH$_4$ gas diluted with H$_2$. Aluminum electrodes were provided on the thin film at 1 mm. intervals by metallizing, and the photoconductivity was measured by a solar simulator in the same manner as in Example 1.

The results are shown in Table 3.

invention is greater than the maximum photoconductivity of $8 \times 10^{-5}$ $(\Omega \cdot cm.)^{-1}$ in the Comparative Example.

Further, amorphous silicon PIN junction solar cells were prepared by employing 20% SiH$_4$ gas diluted with H$_2$, 1,000 p.p.m. B$_2$H$_6$ gas diluted with H$_2$ as a doping gas for P-type films, and 1,000 p.p.m. PH$_3$ gas diluted with H$_2$ as a doping gas for N-type films. The amounts of doping were $B_2H_6/SiH_4=0.2\%$ by mole (P-type) and $PH_3/SiH_4=0.5\%$ by mole (N-type). A P-type amorphous silicon layer having a thickness of 100 angstroms, an intrinsic (I-type) amorphous silicon layer having a thickness of 5,000 angstroms, and an N-type amorphous silicon layer having a thickness of 500 angstroms were formed in order on a glass coated with SnO$_2$ (transparent electrode) of 10 Ω/□. An aluminum electrode of 5 mm. square was provided on the obtained devices by metallizing, and the solar cell characteristics were measured by the solar simulator in the same manner as in Example 1.

The results are shown in Table 4.

TABLE 4

| RF power (W) | 5 | 10 | 20 | 30 | 40 | 50 | 60 | 70 |
|---|---|---|---|---|---|---|---|---|
| Comparative Example 3 | | | | | | | | |
| Conversion efficiency (%) | 4.6 | 5.4 | 4.8 | 4.4 | 4.1 | 3.7 | 3.2 | 2.7 |
| Short-circuit current density (mA/cm$^2$) | 9.5 | 10.7 | 10.1 | 9.3 | 8.9 | 8.2 | 7.6 | 6.5 |
| Open circuit voltage (V) | 0.75 | 0.77 | 0.76 | 0.77 | 0.74 | 0.76 | 0.75 | 0.75 |
| Curve fill factor (%) | 0.65 | 0.65 | 0.63 | 0.62 | 0.62 | 0.60 | 0.57 | 0.55 |
| Example 3 | | | | | | | | |
| Conversion efficiency (%) | 5.0 | 5.1 | 5.3 | 5.1 | 5.1 | 5.0 | 5.1 | 5.0 |
| Short-circuit current density (mA/cm$^2$) | 10.1 | 10.5 | 10.3 | 10.4 | 10.2 | 10.5 | 10.2 | 10.3 |
| Open circuit voltage (V) | 0.76 | 0.75 | 0.78 | 0.77 | 0.77 | 0.75 | 0.76 | 0.75 |
| Curve fill factor (%) | 0.65 | 0.65 | 0.66 | 0.64 | 0.65 | 0.64 | 0.66 | 0.65 |

As understood from Table 4, the devices fabricated according to the present invention show approximately constant solar cell characteristics over a wide range of RF power. On the other hand, in case of the Comparative Example, the solar cell characteristics are remarkably lowered when the thin films are formed under a high RF power condition, in other words, at a high film deposition rate.

TABLE 3

| RF power (W) | 5 | 10 | 20 | 30 | 40 | 50 | 60 | 70 |
|---|---|---|---|---|---|---|---|---|
| Comparative Example 3 | | | | | | | | |
| Film deposition rate (Å/sec) | 0.5 | 0.9 | 1.8 | 2.6 | 3.5 | 4.3 | 5.0 | 5.3 |
| Photoconductivity $(\Omega \cdot cm)^{-1}$ | $6 \times 10^{-5}$ | $8 \times 10^{-5}$ | $7 \times 10^{-5}$ | $3 \times 10^{-5}$ | $2 \times 10^{-5}$ | $1 \times 10^{-5}$ | $9 \times 10^{-6}$ | $6 \times 10^{-6}$ |
| Example 3 | | | | | | | | |
| Film deposition rate (Å/sec) | 0.4 | 0.8 | 1.6 | 2.4 | 3.2 | 4.0 | 4.7 | 5.1 |
| Photoconductivity $(\Omega \cdot cm)^{-1}$ | $1.5 \times 10^{-4}$ | $2 \times 10^{-4}$ | $2.1 \times 10^{-4}$ | $1.9 \times 10^{-4}$ | $2 \times 10^{-4}$ | $2.2 \times 10^{-4}$ | $1.7 \times 10^{-4}$ | $1.5 \times 10^{-4}$ |

It is observed in Table 3 that in case of Comparative Example 3, the photoconductivity is lowered when the radio frequency power is increased, and on the other hand, in case of the present invention, the lowering of the photoconductivity is very small even if the radio frequency power is increased. Even the minimum photoconductivity of $1.5 \times 10^{-4}$ $(\Omega \cdot cm.)^{-1}$ in the present In a study of the dependency of the characteristics of the PIN junction solar cell on the thickness of the I-layer, it was found that in the case of the Comparative Example prepared according to a conventional process, the characteristics were remarkably lowered, particularly in the cases where the I-layer was thin. From this fact, it is considered that there is a difference in the PIN junction characteristic between the Example and the Comparative Example. That is to say, it is considered that in the Example, the junction characteristic is good, but in the Comparative Example, the junction characteristic is bad.

Substantially the same results as obtained in Example 3 can be obtained in solar cells of the type wherein light is incident from the N side.

In addition to the ingredients used in the Examples, other ingredients can be used in the Examples as set forth in the specification to obtain substantially the same results.

What we claim is:

1. In a process for preparing an amorphous silicon semiconductor thin film device including a P-I or N-I interface by glow discharge decomposition of a silicon compound, the improvement which comprises carrying out only the formation of the substantially intrinsic (I) amorphous semiconductor thin film by the glow discharge decomposition in an atmosphere containing a silicon compound in a glow discharge decomposition chamber which has a pan of spaced-apart electrodes, a radio frequency electric field, and a magnetic field crossing the radio frequency electric field at about right angles and in which a substrate is arranged on one of said pair of electrodes substantially at right angles to the radio frequency field, said process including depositing the intrinsic amorphous silicon thin film layer on a P-type or on an N-type amorphous semiconductor substrate to form a P-I or an N-I interface for a homo- or heterojunction photovoltaic device in said magnetron type glow discharge decomposition chamber at a high film deposition rate of above about 3 angstroms/second, with excellent junction characteristics, and without substantially increasing the non-radiative recombination centers in the P-I or the N-I interface, impairing the photoconductivity, or lowering the conversion efficiency of the device.

2. The process of claim 1, wherein said atmosphere further contains at least one member selected from the group consisting of a carbon compound, nitrogen, and a nitrogen compound.

3. The process of claim 2, wherein said nitrogen compound is a hydride of nitrogen.

4. The process of claim 1, wherein said atmosphere contains (a) the silicon compound and at least one of (b) a carbon compound and (c) a nitrogen compound in a (a)/(b)/(c) ratio of A/B/C by mole, the following relationship being present among A, B and C; $(B+C)/(A+B+C) > 0.0001$.

5. The process of claim 4, wherein the following relationship is present among said A, B and C; $(B+C)/(A+B+C) > 0.001$ and $B=0$.

6. The process of claim 1, wherein said intrinsic amorphous silicon semiconductor has a carrier life of not less than $10^{-7}$ second, a density of localized state of not more than $10^{17}/cm^2 \cdot eV$ and a carrier mobility of not less than $10^{-3} \, cm^2/V \cdot sec$.

7. The process of claim 6, wherein the distance between the electrodes in said magnetron type glow discharge decomposition chamber is from 0.5 to 5 cm.

8. The process of claim 7, wherein said glow discharge decomposition is carried out to form a thin film at a rate of above about 3 angstroms/sec. and up to about 50 angstroms/sec.

9. The process of claim 8, wherein said magnetron type glow discharge decomposition chamber is a planar magnetron type or a coaxial magnetron type having electrodes that are spaced apart in a range of distances that depends on the strength of the magnetic field, said range being from about 10 gauss up to about 300 gauss.

10. In a process for preparing amorphous silicon semiconductors for a PIN homo- or hetero-junction thin film photovoltaic device by glow discharge decomposition in an atmosphere containing a silicon compound, the improvement which comprises carrying out the glow discharge decomposition for the preparation of the I-type amorphous silicon thin film layer only in a magnetron type glow discharge decomposition chamber which has spaced-apart electrodes, a radio frequency electric field, and a magnetic field from about 10 gauss and up to about 300 gauss crossing the radio frequency electric field approximately at right angles and in which a substrate is arranged substantially at right angles to the radio frequency field.

11. The process of claim 10, wherein the amorphous silicon thin film layer located at the light incident side of said photovoltaic device and which is P-type or N-type has an optical energy gap of not less than about 1.85 eV and a dark conductivity of not less than about $10^{-8}$ $(\Omega \cdot cm)^{-1}$ at 20° C. and the diffusion potential of the PIN junction is not less than about 1.1 V.

12. The process of claim 11, wherein the P-type layer or N-type layer of the PIN junction photovoltaic device is made of a member selected from the group consisting of a-Si$_{(1-x)}$C$_x$:H, a-Si$_{(1-x)}$C$_x$:F:H, a-Si$_{(1-y)}$N$_y$:H, a-Si$_{(1-y)}$N$_y$:F:H, a-Si$_{(1-x-y)}$C$_x$N$_y$:H and a-Si$_{(1-x-y)}$C$_x$N$_y$:F:H.

13. The process of claim 12, wherein the distance between the electrodes in said magnetron type glow discharge decomposition chamber is from about 0.5 to about 5 cm.

14. The process of claim 13, wherein said glow discharge decomposition is carried out to form a thin film at a rate of about 3 to 50 angstroms/sec.

15. The process of claim 14, wherein said magnetron type glow discharge decomposition chamber is a planar magnetron type.

16. The process of claim 10, which comprises depositing a P-type or N-type amorphous semiconductor layer on a substrate in a glow discharge decomposition chamber having no magnetic field, depositing said I-type amorphous silicon layer on the resulting P-type or N-type amorphous semiconductor layer in said magnetron type glow discharge deomposition chamber at a high film decomposition rate of above about 3 angstroms/second, and depositing an amorphous semiconductor layer of a conductivity type opposite that of said P-type or N-type layer formed on said substrate in a glow discharge decomposition chamber having no magnetic field.

* * * * *